US009651835B2

(12) United States Patent
Moriwaki

(10) Patent No.: US 9,651,835 B2
(45) Date of Patent: May 16, 2017

(54) DISPLAY PANEL

(71) Applicant: Sharp Kabushiki Kaisha, Osaka-shi, Osaka (JP)

(72) Inventor: Hiroyuki Moriwaki, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/759,970

(22) PCT Filed: Dec. 27, 2013

(86) PCT No.: PCT/JP2013/085058
§ 371 (c)(1),
(2) Date: Jul. 9, 2015

(87) PCT Pub. No.: WO2014/109259
PCT Pub. Date: Jul. 17, 2014

(65) Prior Publication Data
US 2015/0346535 A1 Dec. 3, 2015

(30) Foreign Application Priority Data
Jan. 11, 2013 (JP) ................................ 2013-003221

(51) Int. Cl.
G02F 1/161 (2006.01)
G02F 1/1345 (2006.01)
(Continued)

(52) U.S. Cl.
CPC ........ G02F 1/13454 (2013.01); G02F 1/1339 (2013.01); G02F 1/1368 (2013.01);
(Continued)

(58) Field of Classification Search
CPC ... G02F 1/1339; H01L 29/24; Y10T 428/1059
See application file for complete search history.

(56) References Cited

U.S. PATENT DOCUMENTS

2001/0055010 A1    12/2001  Kaise et al.
2005/0184927 A1*    8/2005  Kwak ................. H01L 51/5246
                                                     345/45
(Continued)

FOREIGN PATENT DOCUMENTS

JP    2002-006331 A    1/2002
JP    2004-053815 A    2/2004
(Continued)

OTHER PUBLICATIONS

Official Communication issued in International Patent Application No. PCT/JP2013/085058, mailed on Mar. 18, 2014.

Primary Examiner — Michael Caley
Assistant Examiner — Jonathan Y Jung
(74) Attorney, Agent, or Firm — Keating & Bennett, LLP

(57) ABSTRACT

A display panel (100A) includes a display region (DA) including a plurality of pixel regions and a frame region provided around the display region. The display region includes an organic insulating layer (22) provided on a display medium layer side of a pixel TFT. The frame region includes a seal portion (32), a driving circuit (30), and an extended portion of the organic insulating layer. The extended portion of the organic insulating layer is provided on a display medium layer side of driver TFTs (30A, 30B) and has at least one opening (22a) which is positioned outer than the driver TFTs and which reaches an underlayer. The seal portion (32) overlaps at least part of the driver TFTs and covers at least part of the at least one opening (22a) provided in the extended portion of the organic insulating layer.

14 Claims, 10 Drawing Sheets

(51) Int. Cl.
  *H01L 29/786* (2006.01)
  *H01L 29/24* (2006.01)
  *G02F 1/1333* (2006.01)
  *G02F 1/1368* (2006.01)
  *G02F 1/1343* (2006.01)
  *G02F 1/1339* (2006.01)
  *G02F 1/1362* (2006.01)

(52) U.S. Cl.
  CPC .. *G02F 1/133308* (2013.01); *G02F 1/133345* (2013.01); *G02F 1/134363* (2013.01); *G02F 1/136227* (2013.01); *H01L 29/24* (2013.01); *H01L 29/7869* (2013.01)

(56) References Cited

U.S. PATENT DOCUMENTS

| | | |
|---|---|---|
| 2006/0232740 A1 | 10/2006 | Shigemura et al. |
| 2007/0291194 A1* | 12/2007 | Yoon .................. G02F 1/136209 349/43 |
| 2008/0074577 A1 | 3/2008 | Sato |
| 2009/0236597 A1* | 9/2009 | Ye ....................... H01L 29/7869 257/43 |
| 2010/0165255 A1 | 7/2010 | Ishitani et al. |
| 2010/0253658 A1* | 10/2010 | Tanaka .................. G02F 1/1339 345/205 |
| 2011/0000705 A1* | 1/2011 | Moriwaki ............. G02F 1/1345 174/258 |
| 2011/0134352 A1 | 6/2011 | Nakagawa |
| 2012/0138922 A1 | 6/2012 | Yamazaki et al. |
| 2014/0043574 A1* | 2/2014 | Ichimura ............... G02F 1/1339 349/138 |

FOREIGN PATENT DOCUMENTS

| | | | | |
|---|---|---|---|---|
| JP | 2005-165051 A | 6/2005 | | |
| JP | 2006-301115 A | 11/2006 | | |
| JP | 2008-083308 A | 4/2008 | | |
| JP | 2010-170119 A | 8/2010 | | |
| JP | 2012-134475 A | 7/2012 | | |
| JP | WO 2012/144450 | * | 10/2012 | ....... G02F 1/133345 |
| JP | WO 2012144450 A1 | * | 10/2012 | ........... G02F 1/1339 |
| WO | 2009/072336 A1 | 6/2009 | | |
| WO | 2010/021105 A1 | 2/2010 | | |

\* cited by examiner (a)

(b)

(a)

(b)

(a)

(b)

(a)

(b)

(a)

(b)

DISPLAY PANEL

TECHNICAL FIELD

The present invention relates to a display panel and particularly to a driver-monolithic display panel in which at least part of a driving circuit is integrated with a display panel (hereinafter, referred to as "monolithic display panel").

BACKGROUND ART

Presently, liquid crystal display panels and organic EL display panels are widely used in various forms, ranging from small and middle size display panels for use in cell phones, smartphones, and tablet PCs to large size display panels for use in television sets. Many of the liquid crystal display panels and organic EL display panels are active matrix type (or TFT type) display panels in which each pixel has a TFT ("pixel TFT") and are characterized by high display quality, slim body, and light weight.

In recent years, the techniques for narrowing the frame region of a display panel have been advancing. The frame region refers to a region which surrounds the display region and which does not contribute to display. A monolithic display panel has been put into practice in which at least part of the driving circuit is provided on a TFT substrate of the display panel. The monolithic display panel has the advantages of narrow frame and low cost. For example, Patent Document 1 discloses a monolithic liquid crystal display panel.

Hereinafter, problems in conventional monolithic display panels will be described with an example of a liquid crystal display panel, although the problems are also common among other display panels which have a TFT substrate. For example, in organic EL display panels which have a TFT substrate, substantially all the circuit components are provided on the TFT substrate. However, to protect an organic EL element from the external environment, many of them have such a configuration that a protector substrate is provided so as to oppose the TFT substrate and that these substrates are adhered together by a seal portion.

CITATION LIST

Patent Literature

Patent Document 1: Japanese Laid-Open Patent Publication No. 2002-6331
Patent Document 2: WO 2009/072336

SUMMARY OF INVENTION

Technical Problem

However, in the monolithic liquid crystal display panel disclosed in Patent Document 1, the driving circuit is provided outside the seal portion, and there is room for further narrowing of the frame.

In view of such, the present inventor produced a prototype liquid crystal display panel with the frame being further narrowed by employing a configuration where the seal portion overlaps at least part of the driving circuit provided in the frame region of the TFT substrate, and sometimes found such a problem that the electric characteristics of the TFTs included in the driving circuit ("driver TFTs") varied so that errors occurred in the driving circuit. It was found that this problem was attributed to the fact that the driver TFTs provided in the frame region of the TFT substrate could not be sufficiently protected from the moisture contained in the air.

Note that Patent Document 2 discloses that, in a configuration where a seal portion overlaps at least part of a driving circuit provided in a frame region of a TFT substrate, a moisture blocking film is provided between the seal portion and the driving circuit, whereby decrease of the reliability can be suppressed. However, decrease of the reliability cannot be sufficiently suppressed in some cases even when the configuration of Patent Document 2 is employed. Further, the additional step of forming the moisture blocking film is necessary and thus constitutes a cost-increasing factor.

An object of the present invention is to provide a display panel which has a narrowed frame while variation of the electric characteristics of the driver TFTs in a monolithic display panel is suppressed and occurrence of errors in the driving circuit is reduced.

Solution to Problem

A display panel of an embodiment of the present invention includes: a first substrate; a second substrate arranged so as to oppose the first substrate; a display medium layer provided between the first substrate and the second substrate; a seal portion provided between the first substrate and the second substrate so as to enclose the display medium layer; a plurality of pixel regions each including first and second electrodes for applying a voltage across the display medium layer and a pixel TFT connected with the first electrode; and a driving circuit for supplying a predetermined signal voltage to the pixel TFT of each of the plurality of pixel regions, the driving circuit having a plurality of driver TFTs, wherein the display panel has a display region including the plurality of pixel regions and a frame region provided around the display region, the display region further includes an organic insulating layer provided on the display medium layer side of the pixel TFT, the frame region includes the seal portion, the driving circuit, and an extended portion of the organic insulating layer, the extended portion of the organic insulating layer is provided on the display medium layer side of the plurality of driver TFTs and has at least one opening which is positioned outer than the plurality of driver TFTs and which reaches an underlayer, the seal portion overlaps at least part of the plurality of driver TFTs and covers at least part of the at least one opening provided in the extended portion of the organic insulating layer. The phrase "covering part of the opening" means covering part of a step formed by the opening (a step between the inside and outside of the opening) and does not include a case where the seal portion is present only in the opening.

In one embodiment, the at least one opening provided in the extended portion of the organic insulating layer includes a plurality of grooves extending parallel to one another. As a matter of course, the at least one opening may be a single groove extending parallel to the sides of the first substrate.

In one embodiment, the at least one opening provided in the extended portion of the organic insulating layer continuously extends to at least one side of the first substrate.

In one embodiment, the at least one opening provided in the extended portion of the organic insulating layer is arranged so as to enclose the display region.

In one embodiment, the at least one opening provided in the extended portion of the organic insulating layer is covered with an inorganic layer or a metal layer.

In one embodiment, an inorganic layer or a metal layer is provided in the at least one opening provided in the extended portion of the organic insulating layer.

In one embodiment, the seal portion contains no electrically-conductive particle.

In one embodiment, the plurality of driver TFTs includes a bottom gate TFT.

In one embodiment, the bottom gate TFT has an etch stop structure.

In one embodiment, the plurality of driver TFTs has an In—Ga—Zn—O based semiconductor layer.

In one embodiment, the display medium layer is a liquid crystal layer.

In one embodiment, the first and second electrodes are provided in the first substrate and the display panel operates in a transverse electric field mode.

Advantageous Effects of Invention

According to an embodiment of the present invention, a display panel is provided which has a narrowed frame and in which variation of the electric characteristics of the driver TFTs in a monolithic display panel is suppressed and occurrence of errors in the driving circuit is reduced.

DESCRIPTION OF EMBODIMENTS

Figure 1:
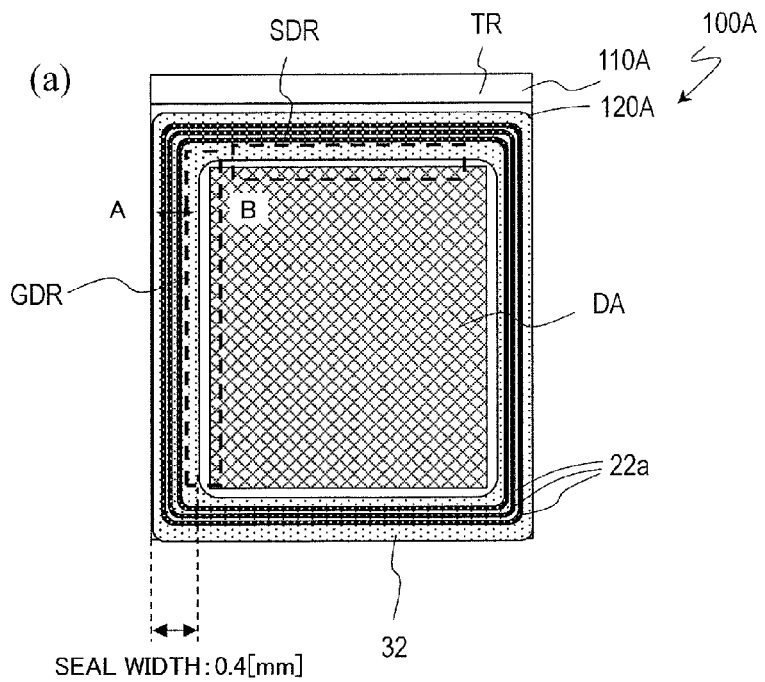
FIG. 1 (a) is a plan view showing a liquid crystal display panel 100A of an embodiment of the present invention. (b) is a cross-sectional view of a TFT substrate 110A included in the liquid crystal display panel 100A, taken along line A-B of (a).
Figure 1:
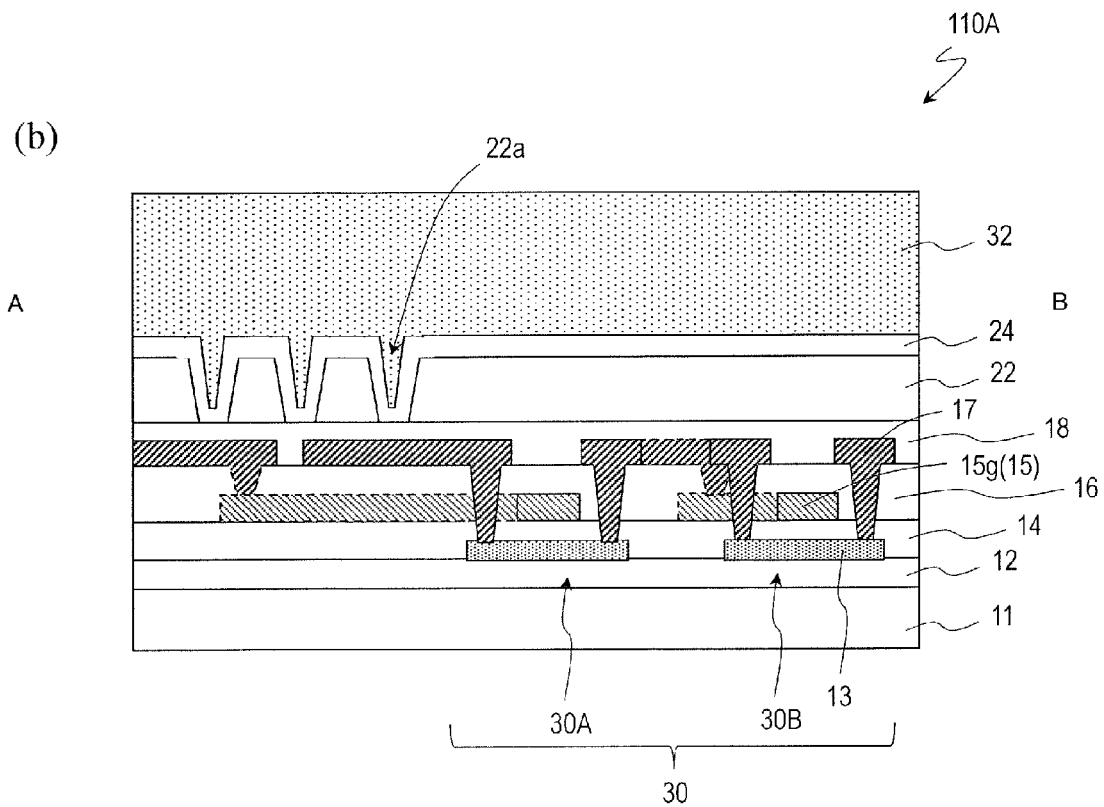

Hereinafter, the configuration of a display panel of an embodiment of the present invention is described in detail with reference to the drawings. Note that, in the following description, a liquid crystal display panel is described as an example, although the display panel of the embodiment of the present invention is not limited to the liquid crystal display panel. For example, the embodiment of the present invention is also applicable to organic EL display panels and electrophoretic display panels which have a TFT substrate.

The liquid crystal display panel which is described below as an example is a transverse electric field mode liquid crystal display panel (e.g., IPS or FFS mode liquid crystal display panel) in which a voltage is applied across a liquid crystal layer by two electrodes (a pixel electrode and a common electrode) provided in the same substrate, although the present invention is applicable to a liquid crystal display panel of a different display mode, such as VA mode.

Firstly, a problem to be solved by the display panel of the embodiment of the present invention is described with reference to FIGS. 10(a) and 10(b). This problem was found by the present inventor.

FIG. 10(a) is a plan view of a liquid crystal display panel 200 of a comparative example. FIG. 10(b) is a cross-sectional view of a TFT substrate 210 included in the liquid crystal display panel 200, taken along line A-B of FIG. 10(a).

As shown in FIG. 10(a), the liquid crystal display panel 200 includes the TFT substrate 210, a counter substrate 220, a liquid crystal layer (not shown) provided between the TFT substrate 210 and the counter substrate 220, and a seal portion 32 provided between the TFT substrate 210 and the counter substrate 220 so as to enclose the liquid crystal layer. A plurality of pixels are arranged in a region of the liquid crystal display panel 200 which is enclosed by the seal portion 32. The plurality of pixels constitute a display region DA. In the display region DA, an alignment film is typically provided for controlling the initial alignment (pretilt angle and pretilt azimuth) of liquid crystal molecules. The display region DA and a region where the alignment film is formed are generally identical with each other.

Each of the plurality of pixels includes a pixel electrode and a pixel TFT (both not shown). A gate bus line and a source bus line are connected to the pixel TFT. A predetermined signal voltage (scan signal voltage) from a gate driver is supplied to the gate bus line at a predetermined timing. A predetermined signal voltage (display signal voltage) from a source driver is supplied to the source bus line at a predetermined timing. The configuration of the TFT liquid crystal display panel is well known in the art, and therefore, detailed description thereof is herein omitted.

The liquid crystal display panel 200 has a gate driver region GDR and a source driver region SDR in a frame region (a region exclusive of the display region DA). The gate driver region GDR may be provided on both left and right sides of the display region DA. In the gate driver region GDR, a gate driving circuit (or "gate driver") including a plurality of driver TFTs is provided. In the source driver region SDR, a source driving circuit (or "source driver") including a plurality of driver TFTs is provided.

The TFT substrate 210 has a rectangular shape which is greater in length than the counter substrate 220 and has a terminal region TR in which the TFT substrate 210 is exposed. This terminal region TR has a terminal portion which is used for electrical connection with external circuits. Terminals of the gate driver are also provided in the terminal region TR. As a matter of course, the shapes of the TFT substrate 210 and the counter substrate 220 are not limited to a rectangular shape which is longer in length than in width.

As shown in FIG. 10(a), the liquid crystal display panel 200 has such a configuration that the seal portion 32 overlaps at least part of the driving circuit provided in the frame region of the TFT substrate 210 (which is present in the gate driver region GDR or the source driver region SDR). Thus, the liquid crystal display panel 200 has a narrower frame than the liquid crystal display panel disclosed in Patent Document 1.

However, in a produced prototype of the liquid crystal display panel 200, errors occurred in the driver TFTs in some cases. This problem is now described with reference to FIG. 10(b).

FIG. 10(b) is a cross-sectional view of the TFT substrate 210 included in the liquid crystal display panel 200, taken along line A-B of FIG. 10(a).

As shown in FIG. 10(b), the frame region of the liquid crystal display panel 200 has the seal portion 32, a driving circuit 30 including driver TFTs 30A and 30B, and an organic insulating layer 22' provided on the liquid crystal layer side of the driver TFTs 30A and 30B. Note that the organic insulating layer 22' is an extended portion of an organic insulating layer which is provided on the liquid crystal layer side of the pixel TFT, and is formed integrally from the display region DA to the frame region. This organic insulating layer 22' is provided so as to cover the substantially entire surface of the TFT substrate 210 including the display region DA and has a function of flattening the surface. In the display region DA, for example, a pixel electrode and/or common electrode is provided on the organic insulating layer.

The driver TFTs 30A and 30B included in the driving circuit (here, gate driver) 30 are top gate TFTs and are configured as described below.

The driver TFTs 30A and 30B are provided on an inorganic insulating underlayer 12 provided on a substrate (e.g., glass substrate) 11.

The driver TFTs 30A and 30B include a semiconductor layer 13 provided on the inorganic insulating underlayer 12, a gate insulating layer 14, a gate electrode 15g provided on the gate insulating layer 14, an inorganic insulating layer 16 provided on the gate electrode 15g, and source and drain electrodes provided on the inorganic insulating layer 16. The source and drain electrodes are formed by a source metal layer 17 and are electrically coupled with the semiconductor layer 13 in contact holes formed in the inorganic insulating layer 16. A gate metal layer 15 that includes the gate electrode 15g may further include a gate bus line integrally formed with the gate electrode 15g, one of the electrodes of a storage capacitance (CS) which is provided as necessary (sometimes referred to as "CS counter electrode"), and a CS bus line connected thereto.

The inorganic insulating underlayer 12 is, for example, $SiO_2$ layer/SiNO layer (e.g., 100 nm/50 nm thick). None of $SiO_2$ and SiNO represents a strict stoichiometric ratio (1:2 or 1:1:1). The $SiO_2$ layer can be formed by CVD with the use of TEOS (Tetra Ethyl Ortho Silicate) as a source material, for example.

The semiconductor layer 13 is, for example, an In—Ga—Zn—O based semiconductor layer (e.g., 45 nm thick). The oxide semiconductor layer includes, for example, an In—Ga—Zn—O based semiconductor. Here, the In—Ga—Zn—O based semiconductor is a ternary oxide of In (indium), Ga (gallium) and Zn (zing). The ratio (composition ratio) of In, Ga and Zn is not particularly limited but may be, for example, In:Ga:Zn=2:2:1, In:Ga:Zn=1:1:1, or In:Ga:Zn=1:1:2. The In—Ga—Zn—O based semiconductor may be amorphous or crystalline. The crystalline In—Ga—Zn—O based semiconductor is preferably a crystalline In—Ga—Zn—O based semiconductor whose c-axis is generally perpendicular to the layer surface. The crystalline structure of such an In—Ga—Zn—O based semiconductor is disclosed in, for example, Japanese Laid-Open Patent Publication No. 2012-134475. The entire disclosures of Japanese Laid-Open Patent Publication No. 2012-134475 are herein incorporated by reference.

A TFT which includes an In—Ga—Zn—O based semiconductor layer (hereinafter, "IGZO_TFT") has high mobility (more than 20 times that of the a-Si TFT) and low current leakage (less than 1/100 of that of the a-Si TFT) and is therefore preferably used as a driver TFT and a pixel TFT.

Examples of the material of the semiconductor layer include oxide semiconductors other than the In—Ga—Zn—O based semiconductor, low-temperature polysilicon, CG silicon (Continuous Grain Silicon), amorphous silicon, and microcrystalline silicon. Among these examples, the low-temperature polysilicon and the CG silicon are preferably used for top gate transistors. For bottom gate transistors which will be described later, the oxide semiconductors, amorphous silicon, and microcrystalline silicon are preferably used.

The gate insulating layer 14 is, for example, a $SiO_2$ layer (e.g., 100 nm thick) and can be formed by CVD with the use of TEOS as a source material as previously described. The gate insulating layer 14 is not limited to a $SiO_2$ layer but may be a SiNO layer, a SiN layer, or a multilayer film of these layers.

The gate metal layer 15 can be formed by, for example, a multilayer film of W layer/TaN layer (upper layer/lower layer). The thicknesses of the W layer/TaN layer are, for example, 370 nm/30 nm. The gate metal layer 15 can be made of a known electrically-conductive material other than the aforementioned materials. The gate metal layer 15 may be a single layer film or a multilayer film. Alternatively, the gate metal layer 15 may be partially formed by a single layer film or a multilayer film.

The inorganic insulating layer 16 can be formed by, for example, a multilayer film of $SiO_2$ layer/SiN layer/$SiO_2$ layer. The thicknesses of the $SiO_2$ layer/SiN layer/$SiO_2$ layer are, for example, 700 nm/250 nm/50 nm.

The source metal layer 17 can be formed by, for example, a multilayer film of Ti layer/Al layer/Ti layer (upper layer/middle layer/lower layer). The thicknesses of the Ti layer/Al layer/Ti layer are, for example, 100 nm/400 nm/100 nm. The source metal layer 17 can be made of a known electrically-conductive material (e.g., Mo) other than the aforementioned materials. The source metal layer 17 may be a single layer film or a multilayer film. Alternatively, the source metal layer 17 may be partially formed by a single layer film or a multilayer film.

The TFTs 30A and 30B are covered with the organic insulating layer 22' and an inorganic insulating layer 24.

The organic insulating layer 22' is, for example, a 2.5 μm thick photosensitive acrylic resin layer. The organic insulating layer 22' has a function of flattening a surface of the substrate on which the TFTs 30A and 30B are provided and can be formed using various insulative resins. Note that, however, if the insulative resin has photosensitivity (positive or negative), the photolithography step for patterning (including formation of contact holes) can be simplified.

The inorganic insulating layer 24 can be formed by, for example, a SiN layer. The thickness of the SiN layer is, for example, 100 nm. The inorganic insulating layer 24 is not limited to a SiN layer but may be a SiNO layer, a $SiO_2$ layer, or a multilayer structure of these layers.

The seal portion 32 is formed by curing a known seal material. The seal material includes a curable resin which can be cured by light or heat.

The liquid crystal display panel 200 has such a configuration that the seal portion 32 overlaps at least part of driver TFTs provided in the frame region (here, TFTs 30A and 30B). Therefore, the distance from a side edge of the TFT substrate 210 to the TFT 30A and/or the TFT 30B is small, and a narrow frame is realized. Thus, in some cases, moisture (damp in the air) reaches the TFT 30A and/or the TFT 30B particularly via the organic insulating layer 22' so that the electric characteristics of the TFT 30A and/or the TFT 30B vary. As the electric characteristics of the TFT 30A and/or the TFT 30B vary, errors sometimes occur in the driving circuit 30. This problem is serious particularly in the In—Ga—Zn—O based semiconductor layer because this layer is susceptible to the influence of moisture.

A liquid crystal display panel of an embodiment of the present invention, which will be described in the following section, has such a configuration that entry of moisture via the organic insulating layer 22' in the liquid crystal display panel 200 is suppressed. This configuration enables to suppress variation of the electric characteristics of the driver TFTs and reduce occurrence of errors in the driving circuit.

FIG. 1 schematically shows a liquid crystal display panel 100A of an embodiment of the present invention. FIG. 1(a) is a plan view of the liquid crystal display panel 100A. FIG. 1(b) is a cross-sectional view of a TFT substrate 110A included in the liquid crystal display panel 100A, taken along line A-B of FIG. 1(a). Note that components of the liquid crystal display panel 100A which have substantially the same functions as those of the liquid crystal display panel 200 are designated by common reference signs, and descriptions thereof are sometimes omitted.

As shown in FIG. 1(a), the liquid crystal display panel 100A includes the TFT substrate 110A, a counter substrate 120A, a liquid crystal layer (not shown) provided between the TFT substrate 110A and the counter substrate 120A, and a seal portion 32 provided between the TFT substrate 110A and the counter substrate 120A so as to enclose the liquid crystal layer. A plurality of pixels are arranged in a region of the liquid crystal display panel 100A which is enclosed by the seal portion 32. The plurality of pixels constitute a display region DA. In the display region DA, an alignment film is typically provided for controlling the initial alignment of liquid crystal molecules. The display region DA and a region where the alignment film is formed are generally identical with each other.

The liquid crystal display panel 100A has a gate driver region GDR and a source driver region SDR in a frame region (a region exclusive of the display region DA). The gate driver region GDR may be provided on both left and right sides of the display region DA. In the gate driver region GDR, a gate driving circuit (or "gate driver") including a plurality of driver TFTs is provided. In the source driver region SDR, a source driving circuit (or "source driver") including a plurality of driver TFTs is provided.

The TFT substrate 110A has a rectangular shape which is greater in length than the counter substrate 120A and has a terminal region TR in which the TFT substrate 110A is exposed. This terminal region TR has a terminal portion which is used for electrical connection with external circuits. Terminals of the gate driver are also provided in the terminal region TR. As a matter of course, the shapes of the TFT substrate 110A and the counter substrate 120A are not limited to a rectangular shape which is longer in length than in width.

As shown in FIG. 1(a), the liquid crystal display panel 100A has such a configuration that the seal portion 32 overlaps at least part of the driving circuit provided in the frame region of the TFT substrate 110A (which is present in the gate driver region GDR or the source driver region SDR). Thus, as does the liquid crystal display panel 200, the liquid crystal display panel 100A has a narrower frame than the liquid crystal display panel disclosed in Patent Document 1. Note that, when the liquid crystal display panel 100A is a 7-inch model, the width of the seal portion 32 is, for example, 0.4 mm. In general, when the liquid crystal display panel 100A is a 4-inch to 10-inch model, the width of the seal portion 32 is not less than 0.2 mm and not more than 0.5 mm. When the liquid crystal display panel 100A is a 40-inch to 70-inch model, the width of the seal portion 32 is not less than 0.8 mm and not more than 1.5 mm.

The liquid crystal display panel 100A is different from the liquid crystal display panel 200 in that openings 22a are provided in an extended portion of an organic insulating layer 22. The organic insulating layer 22 is an extended portion of an organic insulating layer which is provided on the liquid crystal layer side of the pixel TFT, and is formed integrally from the display region DA to the frame region. The organic insulating layer 22 is provided so as to cover the substantially entire surface of the TFT substrate 110A including the display region DA and has a function of flattening the surface. In the display region DA, for example, a pixel electrode or a common electrode is provided on the organic insulating layer 22.

The openings 22a provided in the extended portion of the organic insulating layer 22 of the liquid crystal display panel 100A are through holes which are positioned outer than the driver TFTs 30A and 30B and which reach an underlayer. The openings 22a are realized by three groove-shaped openings 22a extending parallel to one another. Such openings 22a are sometimes simply referred to as "grooves". The openings 22a provided in the organic insulating layer 22 of the liquid crystal display panel 100A are arranged so as to enclose the display region DA, i.e., in an annular arrangement. As a matter of course, the number of the openings 22a is not limited to three but may be at least one. The openings 22a do not need to entirely enclose the display region DA but may be partially interrupted. It is preferred that a plurality of openings 22a are provided around a region which is to be sufficiently protected in consideration of the arrangement of the driver TFTs 30A and 30B, and the like.

As shown in FIG. 1(b), the frame region of the liquid crystal display panel 100A includes the seal portion 32, the driving circuit 30 that has the driver TFTs 30A and 30B, and the organic insulating layer 22 that is provided on the liquid crystal layer side of the driver TFTs 30A and 30B. In the TFT substrate 110A, the TFTs 30A and 30B are covered with an inorganic insulating layer 18, the organic insulating layer 22, and the inorganic insulating layer 24.

The inorganic insulating layer 18 can be formed by, for example, a SiN layer. The thickness of the SiN layer is, for example, 250 nm. The inorganic insulating layer 18 is not limited to the SiN layer but may be a SiNO layer, a $SiO_2$ layer, or a multilayer structure of these layers. The organic insulating layer 22 and the inorganic insulating layer 24 can be formed of the same materials in the same way as in the liquid crystal display panel 200.

The extended portion of the organic insulating layer 22 has the openings 22a that reach the underlying inorganic insulating layer 18. Inside the openings 22a, the inorganic insulating layer 18 is provided. The inorganic insulating layer 24 provided on the organic insulating layer covers the openings 22a and is in contact with the inorganic insulating layer 18 in the openings 22a of the organic insulating layer 22.

The seal portion 32 overlaps the driver TFTs 30A and 30B and covers the openings 22a provided in the extended portion of the organic insulating layer 22. The seal portion 32 does not necessarily need to overlap all of the plurality of driver TFTs included in the driving circuit 30. Note that, however, the seal portion 32 preferably overlaps the outermost driver TFT (here, driver TFT 30A). When the inorganic insulating layer 24 is omitted, the seal portion 32 is in contact with an underlayer of the organic insulating layer 22 in the openings 22a of the organic insulating layer 22.

Figure 10:
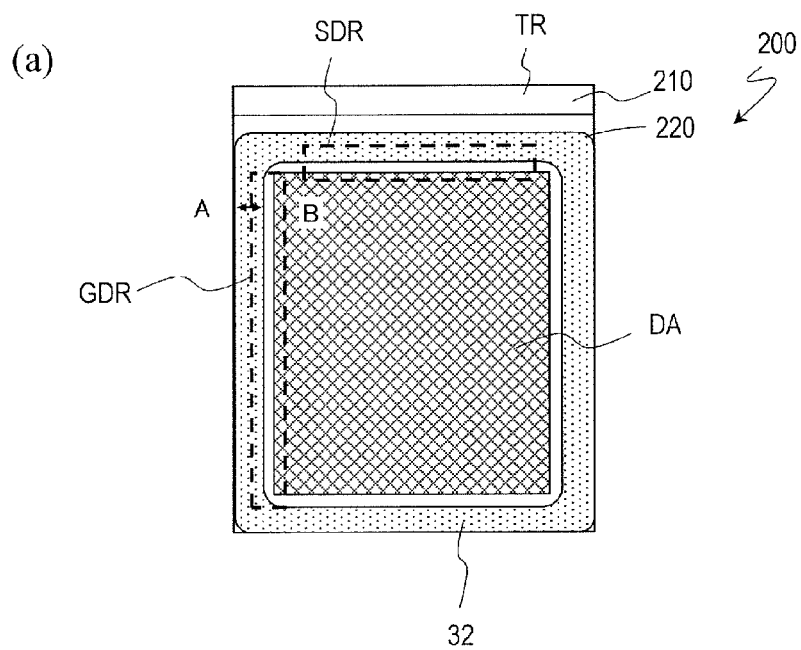
FIG. 10 (a) is a plan view showing a liquid crystal display panel 200 of a comparative example. (b) is a cross-sectional view of a TFT substrate 210 included in the liquid crystal display panel 200, taken along line A-B of (a).
Figure 10:
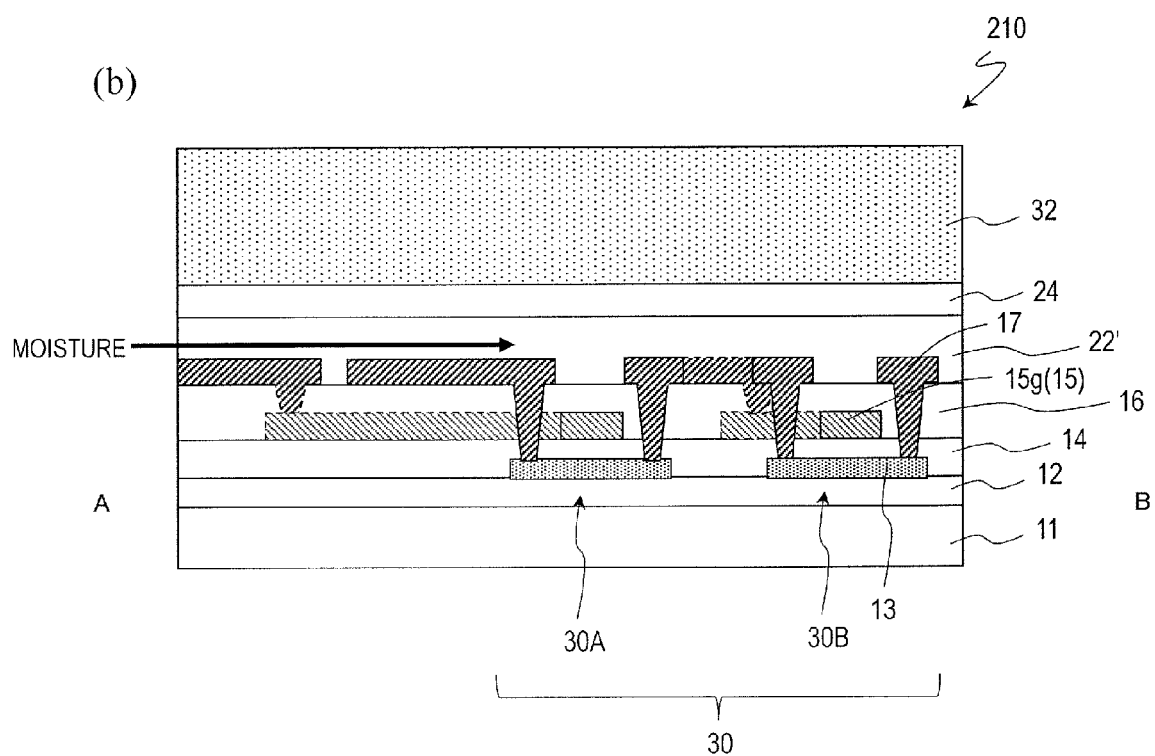

Now, moisture entering from an end face of the TFT substrate 110A shown in FIG. 1(*b*) (on the left side of FIG. 1(*b*)) via the organic insulating layer 22 is discussed with comparative reference to FIG. 10. Moisture entering from the left to the right inside the organic insulating layer 22 reaches the openings 22a. Here, the advance of the moisture is suppressed by the inorganic insulating layers 18 and 24 provided in the openings 22a of the organic insulating layer 22. If the inorganic insulating layers 18 and 24 are omitted, the seal portion 32 that fills the openings 22a and the underlayer (inorganic layer or metal layer) in the openings 22a will suppress the advance of the moisture. Note that the inorganic insulating layer 24 produces a higher effect of suppressing the advance of the moisture than the cured resin that forms the seal portion 32.

The organic insulating layer 22 of the TFT substrate 110A has the groove-shaped openings 22a that are in an annular arrangement so as to enclose the display region DA. Therefore, the advance of the moisture from each of the end faces of the TFT substrate 110A can be suppressed. Since the groove-shaped openings 22a are in a triple ring arrangement, the effect of suppressing the advance of the moisture is still higher. Note that, in the cross-sectional view of FIG. 1(*b*), the size (width) of each of the openings 22a is, for example, 10 μm, and the distance between adjacent openings 22a is, for example, 10 μm. Therefore, in the cross-sectional view of FIG. 1(*b*), the total width of the openings 22a in a triple ring arrangement is, for example, about 50 μm. The width of the grooves (openings 22a), the number of parallelly extending grooves, and the distance between adjacent grooves can be appropriately modified when necessary. For example, the groove-shaped openings 22a may not be in an annular arrangement, but there may be a region where the openings 22a are partially absent. Alternatively, a single groove in a spiral arrangement may be provided instead of providing a plurality of parallelly extending grooves. This arrangement also achieves the same effect as that achieved by the plurality of parallelly extending grooves. Although simply providing a single groove extending parallel to the sides of the TFT substrate 110A can achieve the effect to some extent, providing a plurality of grooves can further improve the effect of suppressing the advance of the moisture.

The material of the organic insulating layer 22 is, for example, a photosensitive acrylic resin as previously described. For example, heat-resistant transparent photosensitive protection films of OPTMER PC and NN series manufactured by JSR Corporation can be suitably used (OPTMER is a registered trademark). The thickness of the organic insulating layer 22 is preferably not less than 1.5 μm and not more than 3.5 μm, more preferably not less than 2.0 μm and not more than 2.5 μm. If the organic insulating layer 22 is excessively thin, flattening of the surface is difficult. On the contrary, if the organic insulating layer 22 is excessively thick, the surface sometimes has unevenness. As the thickness of the organic insulating layer 22 increases, the material cost also increases.

The width of the grooves (openings) 22a provided in the organic insulating layer 22 and the distance between two adjacent grooves (22a) are each preferably not less than 1.5 μm and not more than 30.0 μm, more preferably not less than 4.0 μm and not more than 20.0 μm. The ratio between the width of the grooves (openings) 22a and the distance between two adjacent grooves (22a) is, for example, about 1:1. The lower limit of the width of the grooves (and/or the distance between adjacent grooves) depends on, for example, the processing accuracy of the photosensitive acrylic resin. The upper limit of the width of the grooves is not particularly determined. However, if the width of the grooves is excessively large, such a problem sometimes occurs that it is difficult to control the gap between the substrates using particle spacers (in a spherical or fiber shape) mixed in the seal material, for example. Hence, the width of the grooves may be decreased, or the width of the grooves may be partially decreased, in consideration of the size of the particle spacers. The occupancy of the grooves to the seal portion 32 may be not more than 20%. As a matter of course, the above problem can be avoided when photospacers (column-shaped spacers) are used and placed at predetermined positions.

Figure 2:
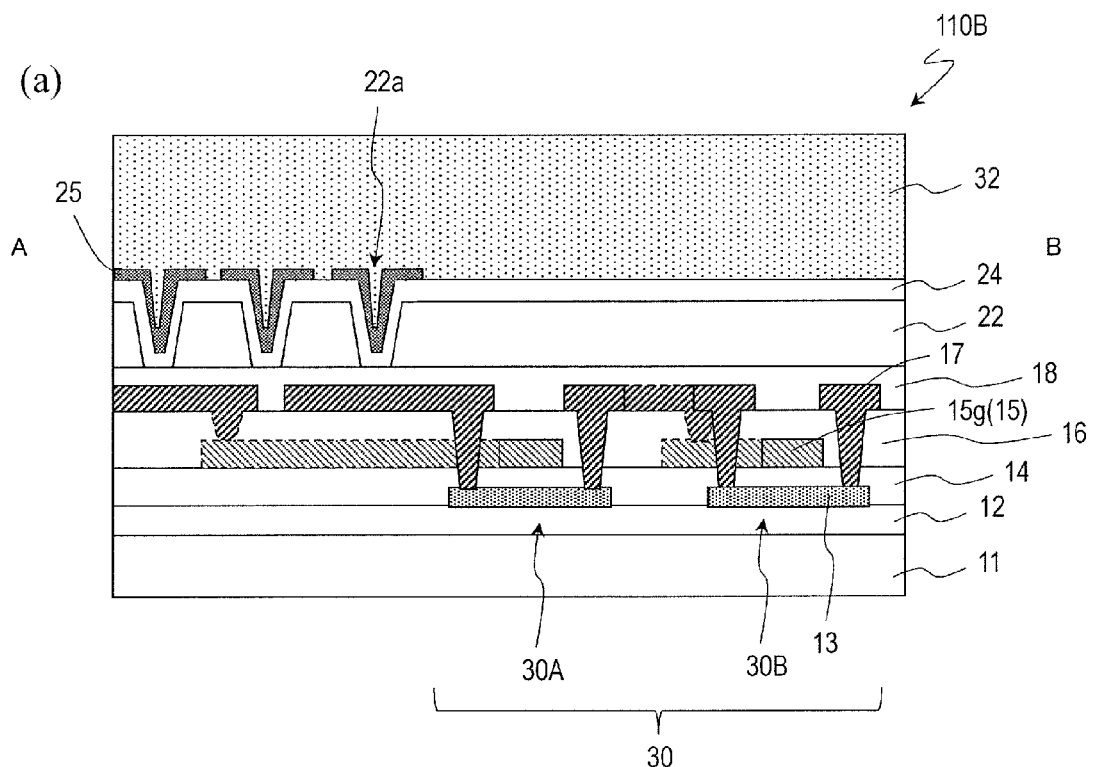
FIG. 2 (a) is a cross-sectional view of a TFT substrate 110B included in another liquid crystal display panel of an embodiment of the present invention. (b) is a cross-sectional view of a TFT substrate 110C included in still another liquid crystal display panel of an embodiment of the present invention.
Figure 2:
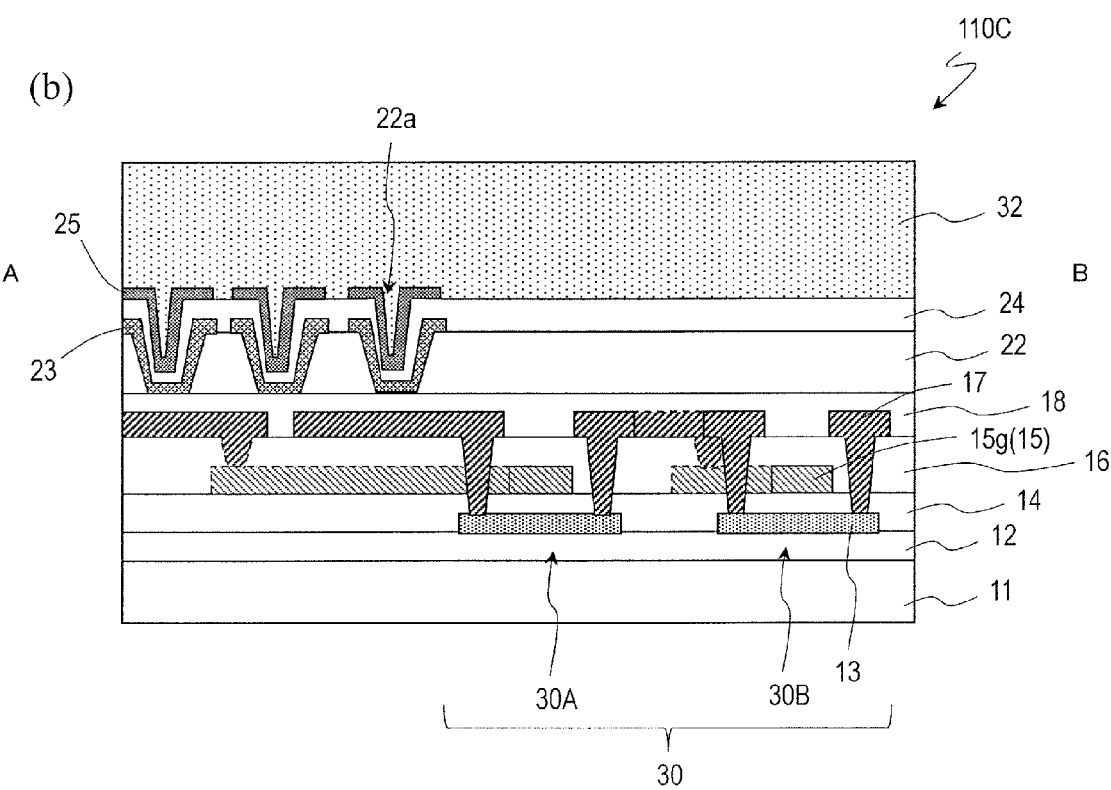

Next, the configurations of a TFT substrate 110B and a TFT substrate 110C of other liquid crystal display panels according to an embodiment of the present invention are described with reference to FIGS. 2(*a*) and 2(*b*). FIG. 2(*a*) is a cross-sectional view of the TFT substrate 110B. FIG. 2(*b*) is a cross-sectional view of the TFT substrate 110C.

The TFT substrate 110B shown in FIG. 2(*a*) is different from the TFT 110A shown in FIG. 1 in that an overlying conductive layer 25 is further provided on the inorganic insulating layer 24 that is provided over the openings 22a of the organic insulating layer 22. The overlying conductive layer 25 is, for example, a pixel electrode or common electrode in a FFS mode liquid crystal display panel. Since the openings 22a are covered not only with the inorganic insulating layer 24 but also with the overlying conductive layer 25, the effect of suppressing the advance of the moisture further improves. The overlying conductive layer 25 is formed by, for example, an electrically-conductive oxide layer (inorganic layer), such as an ITO layer, or a metal layer.

From the viewpoint of the adhesive strength of the seal portion 32, the surface in the openings 22a of the organic insulating layer 22 (the surface of the underlayer of the organic insulating layer 22) is most preferably a glass substrate. The other candidates, a metal layer, an ITO layer, and an inorganic insulating layer, are less preferred in this order. The most excellent adhesive state is direct bonding of the seal portion 32 and the glass substrate, and therefore, the structure is preferably as simple as possible.

The TFT substrate 110C shown in FIG. 2(b) is different from the TFT 110B shown in FIG. 2(a) in that an underlying conductive layer 23 is further provided under the inorganic insulating layer 24 that is provided over the openings 22a of the organic insulating layer 22. The underlying conductive layer 23 is, for example, a common electrode or pixel electrode in a FFS mode liquid crystal display panel (in this case, the overlying conductive layer 25 is a pixel electrode or common electrode). Since the openings 22a are covered with the underlying conductive layer 23, the inorganic insulating layer 24 and the overlying conductive layer 25, the effect of suppressing the advance of the moisture further improves. The underlying conductive layer 23 can also be formed by, for example, an electrically-conductive oxide layer (inorganic layer), such as an ITO layer, or a metal layer, as is the overlying conductive layer 25.

Figure 3:
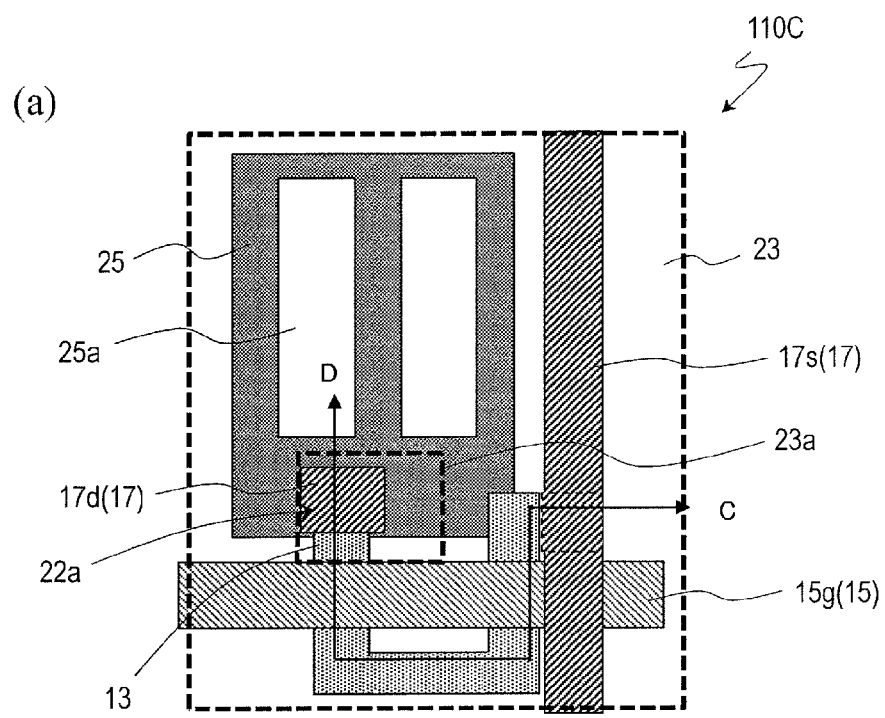
FIG. 3 Diagrams showing the configuration of a pixel portion of the TFT substrate 110C. (a) is a plan view of the TFT substrate 110C. (b) is a cross-sectional view of the TFT substrate 110C taken along line C-D of (a).
Figure 3:
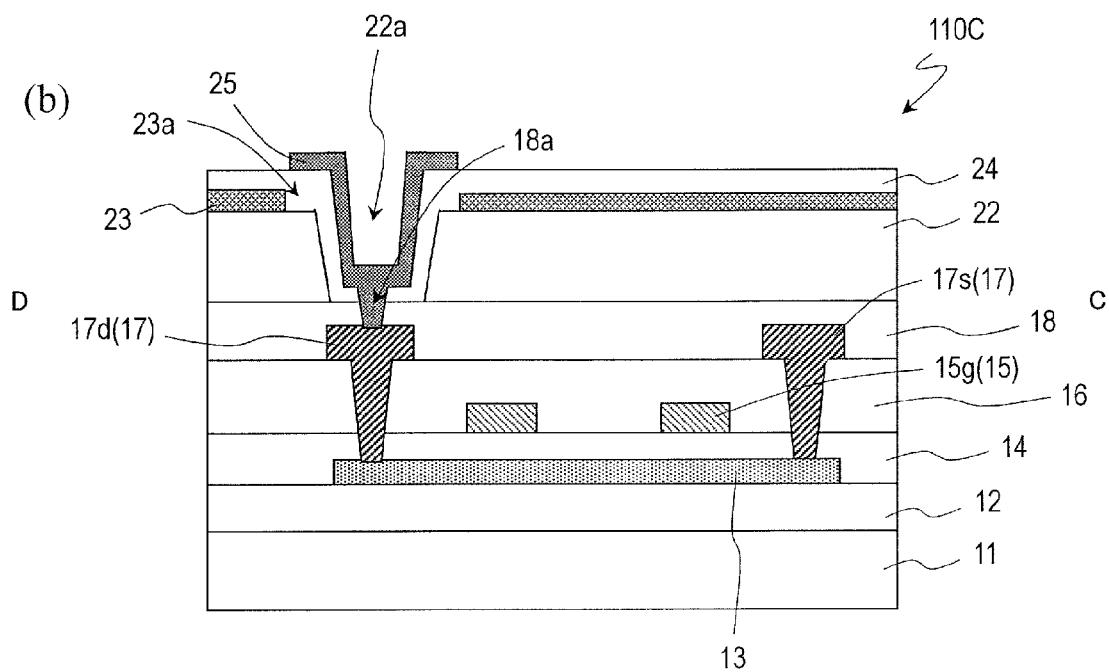

Here, the configuration of a pixel portion of the TFT substrate 110C is described with reference to FIGS. 3(a) and 3(b). FIG. 3(a) is a plan view of the pixel portion of the TFT substrate 110C. FIG. 3(b) is a cross-sectional view of the TFT substrate 110C taken along line C-D of FIG. 3(a). Note that the pixel portion of the TFT substrate 110B shown in FIG. 2(b) can have the configuration shown in FIGS. 3(a) and 3(b).

As shown in FIG. 3(a), the TFT substrate 110C is a TFT substrate for a FFS mode liquid crystal display panel, which includes a common electrode (underlying conductive layer) 23 and a pixel electrode (overlying conductive layer) 25. The pixel electrode 25 has two slits 25a extending parallel to each other and opposes the common electrode 23 via the inorganic insulating layer 24. The common electrode 23 extends generally entirely across the display region DA except for an opening 23a that is provided for a contact portion for connection of the pixel electrode 25 with the drain electrode of the pixel TFT. An electric field which depends on the potential difference between the common electrode 23 and the pixel electrode 25 is produced across the liquid crystal layer that is provided on the TFT substrate 110C. The electric field produced across the liquid crystal layer has a transverse component (a component parallel to the plane of the liquid crystal layer) due to the opening (slit) 23a of the pixel electrode 25.

The pixel TFT includes the semiconductor layer 13 that is formed by patterning a semiconductor film which is the same as the semiconductor layer of the driver TFT, a gate bus line 15g including a gate electrode 15 which is formed by patterning the gate metal layer 15, and a source bus line 17s including a source electrode and a drain electrode 17d which are formed by patterning the source metal layer 17. As shown in FIG. 3(a), the semiconductor layer 13 has a U-shape and has two intersections with the gate bus line 15g. Portions of the gate bus line 15g overlapping the semiconductor layer 13 with the gate insulating layer 14 interposed therebetween function as the gate electrode. The pixel TFT shown as an example has a double gate configuration, although it is not limited to this configuration. The pixel electrode 25 is connected with the drain electrode 17d in a contact hole 18a provided in the inorganic insulating layer 18 and an opening (contact hole) 22a provided in the organic insulating layer 22.

In the TFT substrate 110C of the above-described FFS mode liquid crystal display panel, the overlying conductive layer 25 functions as the pixel electrode while the underlying conductive layer 23 functions as the common electrode, although the opposite case is also possible.

Figure 4:
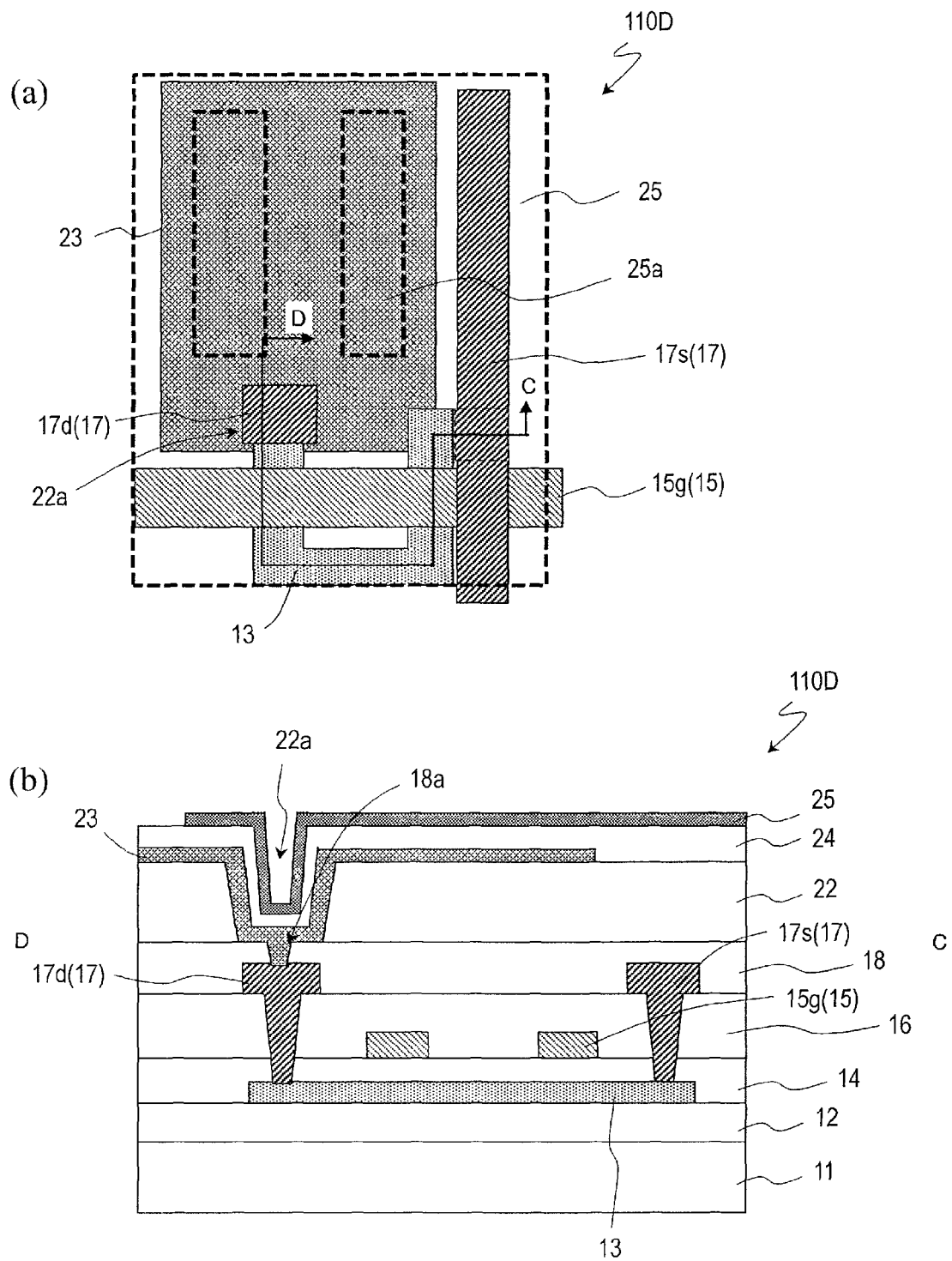
FIG. 4 Diagrams showing the configuration of a pixel portion of a TFT substrate 110D included in still another liquid crystal display panel of an embodiment of the present invention. (a) is a plan view of the TFT substrate 110D. (b) is a cross-sectional view of the TFT substrate 110D taken along line C-D of (a).

In the TFT substrate 110D shown in FIGS. 4(a) and 4(b), the overlying conductive layer 25 functions as the common electrode while the underlying conductive layer 23 functions as the pixel electrode. In the TFT substrate 110D, the common electrode 25 has two slits 25a extending parallel to each other, and the pixel electrode 23 opposes the common electrode 25 via the inorganic insulating layer 24. The pixel electrode 23 has no slit. The pixel electrode 23 is connected with the drain electrode 17d in a contact hole 18a provided in the inorganic insulating layer 18 and an opening (contact hole) 22a provided in the organic insulating layer 22.

The FFS mode liquid crystal display panel is not limited to the above-described example but may have any of various known configurations. By covering the openings 22a of the organic insulating layer 22 using various inorganic layers and metal layers without being limited to the above-described example, the advance of the moisture can be suppressed. Note that the inorganic layers include not only inorganic insulating layers but also inorganic conductive layers, such as ITO.

Figure 5:
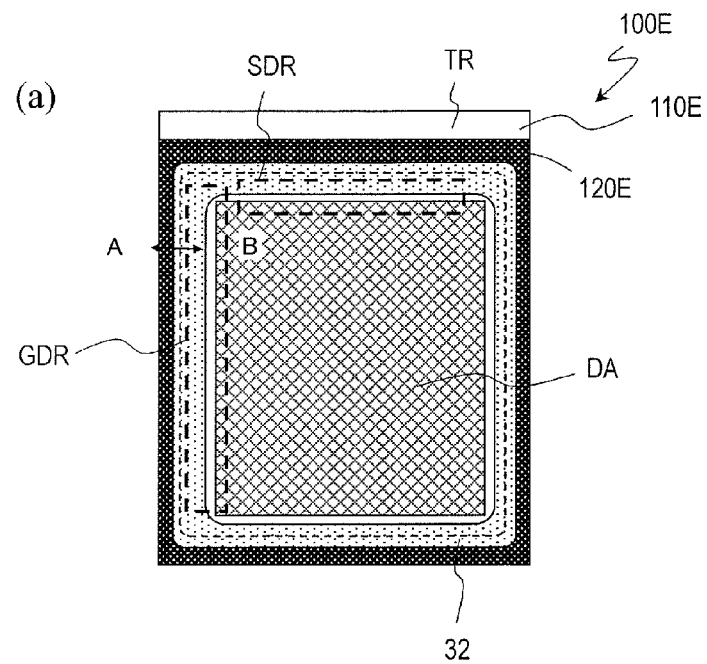
FIG. 5 (a) is a plan view showing a liquid crystal display panel 100E of still another embodiment of the present invention. (b) is a cross-sectional view of a TFT substrate 110E included in the liquid crystal display panel 100E, taken along line A-B of (a).
Figure 5:
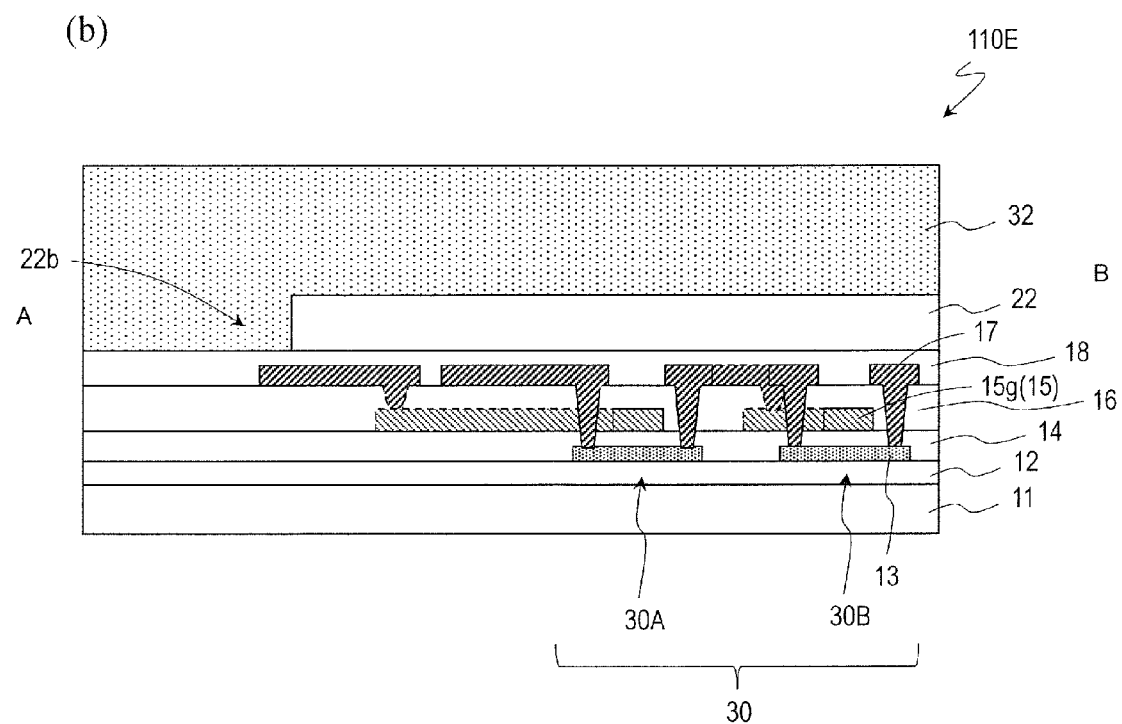

Next, the configurations of a liquid crystal display panel 100E of another embodiment of the present invention and a TFT substrate 110E included in the liquid crystal display panel 100E are described with reference to FIGS. 5(a) and 5(b). FIG. 5(a) is a plan view showing the liquid crystal display panel 100E. FIG. 5(b) is a cross-sectional view of the TFT substrate 110E taken along line A-B of FIG. 5(a).

As shown in FIG. 5(a), the liquid crystal display panel 100E includes the TFT substrate 110E, a counter substrate 120E, a liquid crystal layer (not shown) provided between the TFT substrate 110E and the counter substrate 120E, and a seal portion 32 provided between the TFT substrate 110E and the counter substrate 120E so as to enclose the liquid crystal layer.

An extended portion of the organic insulating layer 22 included in the TFT substrate 110E has an opening 22b. At every one of the four sides of the substrate 11, the opening (removed portion) 22b of the extended portion of the organic insulating layer 22 continuously extends from the outside of the driver TFTs 30A and 30B of the driving circuit 30 to the side of the substrate 11. As a matter of course, the opening 22b continuously extending to the side of the substrate 11 does not need to be provided at every one of the four sides of the substrate 11. The opening 22b may be provided at at least one side. Further, the opening 22b that has such a configuration and the openings 22a provided in the organic insulating layer 22 of the previously-described TFT substrate 110A may be used in combination.

Note that the seal portion 32 may cover at least part of the opening 22b. Here, "covering part of the opening" means covering part of a step formed by the opening (a step between the inside and outside of the opening). Thus, by employing a configuration where the seal portion 32 covers part of the opening 22b of the organic insulating layer 22, the side faces of the organic insulating layer 22 are protected by the seal portion 32. Therefore, the effect of suppressing entry of the moisture via the organic insulating layer 22 can be achieved.

In the configuration of the TFT substrate 110E, the seal portion 32 is in direct contact with the inorganic insulating layer 18, and the cured resin that forms the seal portion 32 is more excellent in the effect of suppressing the advance of the moisture than the organic insulating layer 22. Thus, arrival of the moisture at the driver TFTs 30A and 30B can be suppressed. Since the cured resin that forms the seal portion 32 is more excellent in adhesion with the underlying inorganic insulating layer 18 than the organic insulating layer 22, the effect of suppressing the advance of the moisture at the interface is also excellent. When the configuration of the TFT substrate 110E is employed, it is possible to use the organic insulating layer 22 as a mask for etching of the underlying inorganic insulating layer 18. Thus, the advantage of reducing the number of photomasks is achieved.

The liquid crystal display panel of the above-described embodiments have top gate TFTs, although the liquid crystal display panel of the embodiment of the present invention is not limited to these examples but is applicable to a panel which has bottom gate TFTs.

Figure 6:
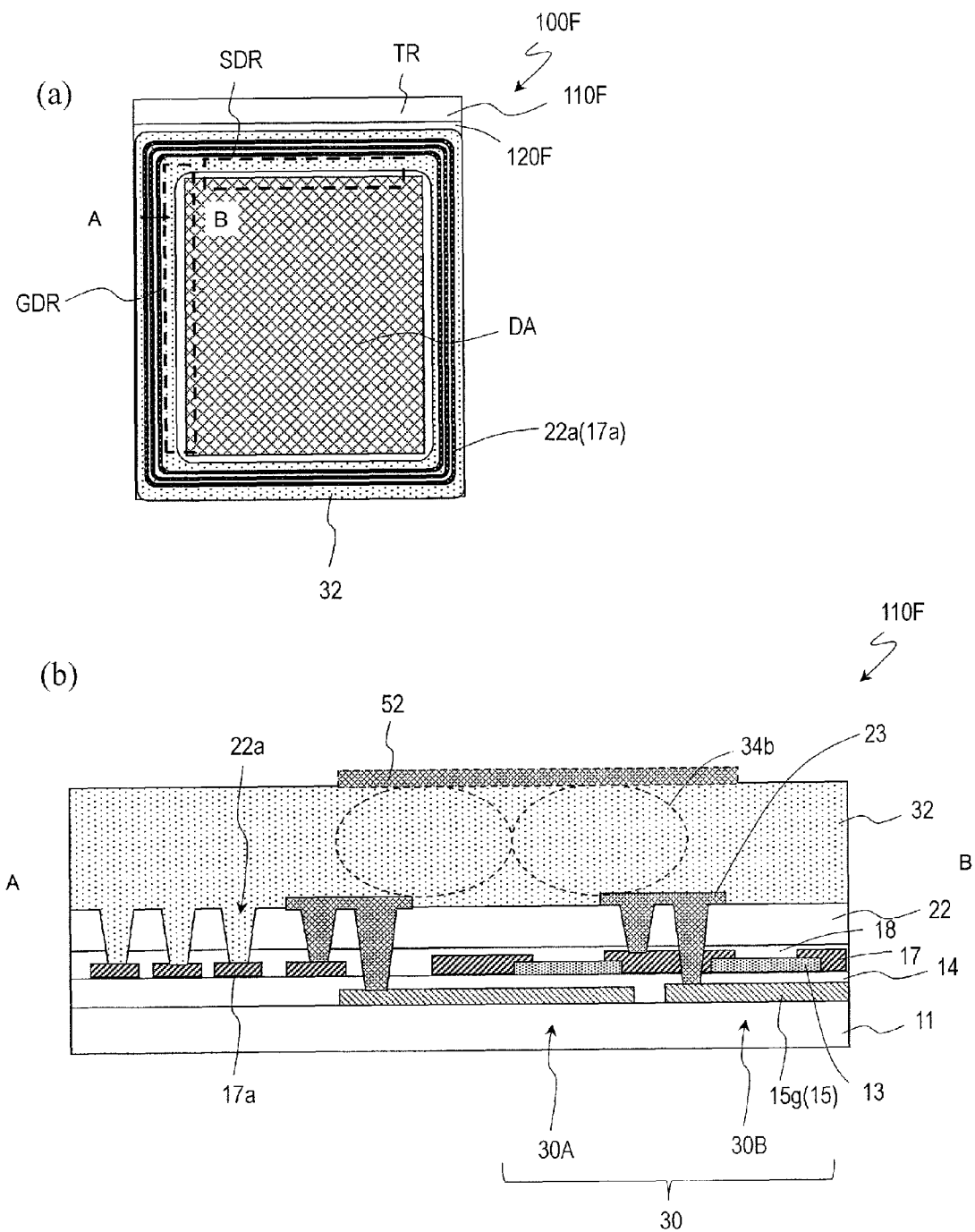
FIG. 6 (a) is a plan view showing a liquid crystal display panel 100F of still another embodiment of the present invention. (b) is a cross-sectional view of a TFT substrate 110F included in the liquid crystal display panel 100F, taken along line A-B of (a).
Figure 7:
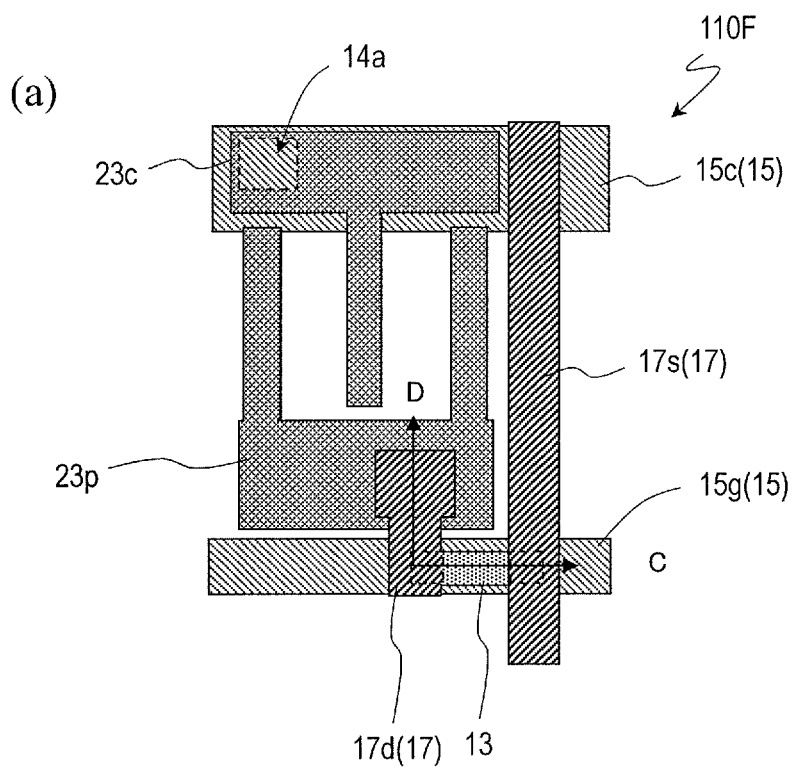
FIG. 7 Diagrams showing the configuration of a pixel portion of the TFT substrate 110F. (a) is a plan view of the TFT substrate 110F. (b) is a cross-sectional view of the TFT substrate 110F taken along line C-D of (a).
Figure 7:
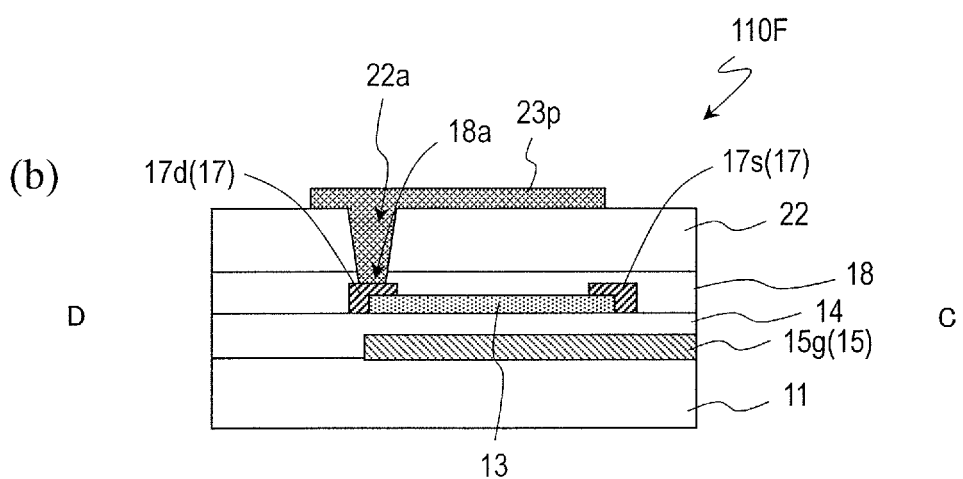

The configurations of a liquid crystal display panel 100F which has bottom gate TFTs and a TFT substrate 110F included in the liquid crystal display panel 100F are described with reference to FIG. 6 and FIG. 7. The liquid crystal display panel 100F which is described herein as an example is an IPS mode liquid crystal display panel.

FIG. 6(a) is a plan view showing the liquid crystal display panel 100F. FIG. 6(b) is a cross-sectional view of the TFT substrate 110F taken along line A-B of FIG. 6(a). As shown in FIG. 6(a), the liquid crystal display panel 100F includes the TFT substrate 110F, a counter substrate 120F, a liquid crystal layer (not shown) provided between the TFT substrate 110F and the counter substrate 120F, and a seal portion 32 provided between the TFT substrate 110F and the counter substrate 120F so as to enclose the liquid crystal layer.

The openings 22a provided in the extended portion of the organic insulating layer 22 of the TFT substrate 110F are through holes which are positioned outer than the driver TFTs 30A and 30B and which reach an underlayer, as are the openings 22a provided in the extended portion of the organic insulating layer 22 of the TFT substrate 110A shown in FIG. 1. The openings 22a are realized by three groove-shaped openings 22a extending parallel to one another. Here, the inorganic insulating layer 18 underlying the openings 22a of the organic insulating layer also have openings, and an underlying metal layer 17a which is formed by the source metal layer 17 is provided in the openings of the inorganic insulating layer 18. The seal portion 32 provided on the organic insulating layer 22 covers the openings 22a of the organic insulating layer 22 and is in contact with the underlying metal layer 17a in the openings 22a. When employing such a configuration, the advance of the moisture entering via the organic insulating layer 22 is suppressed by the seal portion 32 provided in the openings 22a of the organic insulating layer 22. Further, since the adhesion between the seal portion 32 and the underlying metal layer 17a is excellent, entry of the moisture from the interface is also prevented. Further, since the underlying metal layer 17a functions as an etch stop layer in the etching step for formation of the openings 22a in the organic insulating layer 22, a wire which is formed by the gate metal layer 15 can be provided under the underlying metal layer 17a with the gate insulating layer 14 interposed therebetween.

The TFTs 30A and 30B of the TFT substrate 110F are bottom gate TFTs and include the gate metal layer 15 including a gate electrode 15g which is provided on the substrate (e.g., glass substrate) 11, the gate insulating layer 14 provided on the gate metal layer 15, the semiconductor layer 13 provided on the gate insulating layer 14, and the source metal layer 17 including a source electrode and a drain electrode which is provided so as to partially overlap the semiconductor layer 13. In the bottom gate TFTs, the semiconductor layer 13 is provided at a higher level (on the liquid crystal layer side) as compared with the top gate TFTs, and therefore, variation of the electric characteristics due to the moisture is more likely to occur than in the top gate TFTs. Thus, a more remarkable effect is achieved by providing the openings 22a in the organic insulating layer 22 as in the present embodiment such that the advance of the moisture is suppressed.

Further, when employing a configuration where the electrode 23 that couples the gate metal layer 15 to the source metal layer 17 is provided on the organic insulating layer 22 as shown in FIG. 6(b), if electrically-conductive particles 34b are contained in the seal portion 32, there is a probability that they cause a short circuit. To prevent this short circuit, using a seal material which contains no electrically-conductive particles is preferred. Note that a transverse electric field mode liquid crystal display panel, such as the liquid crystal display panel 100F, does not have a common electrode (designated by reference numeral 52 in FIG. 6(b)) in the counter substrate, and therefore, a short circuit does not occur between the counter electrode and the electrode 23 of the driving circuit 30.

Next, the configuration of a pixel portion of the TFT substrate 110F is described with reference to FIGS. 7(a) and 7(b). FIG. 7(a) is a plan view of the pixel portion of the TFT substrate 110F. FIG. 7(b) is a cross-sectional view of the TFT substrate 110F taken along line C-D of FIG. 7(a).

As shown in FIG. 7(a), the TFT substrate 110F is a TFT substrate for an IPS mode liquid crystal display panel, in which comb teeth electrodes are provided such that a common electrode 23c and a pixel electrode 23p mesh with each other. The common electrode 23c is electrically coupled with a CS bus line 15c, which is formed by the gate metal layer 15, in a contact hole 14a. The pixel electrode 23p is connected with the drain electrode 17d, which is formed by the source metal layer 17, in an opening (contact hole) 22a of the organic insulating layer 22 and an opening (contact hole) 18a of the inorganic insulating layer 18 as shown in FIG. 7(b). The gate electrode 15g is provided under the semiconductor layer 13 with the gate insulating layer 14 interposed therebetween. This pixel TFT is also a bottom gate TFT.

Both the driver TFT and the pixel TFT included in the above-described TFT substrate 110F are channel etch (CE-type) TFTs. Only the inorganic insulating layer 18 is present between the semiconductor layer 13 and the organic insulating layer 22, so that the moisture is likely to reach the semiconductor layer 13. On the contrary, when employing a bottom gate TFT which has an etch stop layer on the channel region of the semiconductor layer, the etch stop layer performs the function of protecting the channel region of the semiconductor layer 13 from the moisture.

Figure 8:
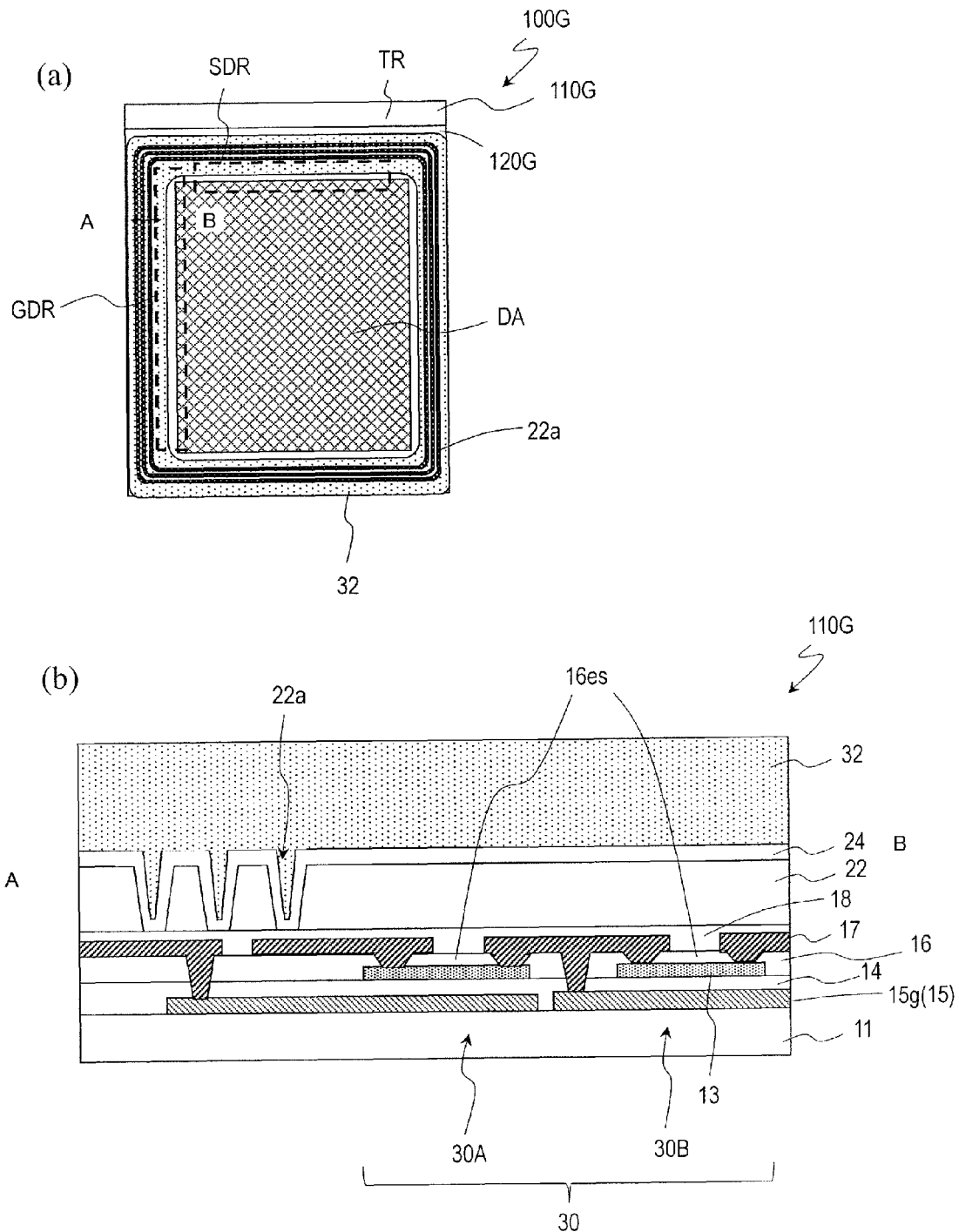
FIG. 8 (a) is a plan view showing a liquid crystal display panel 100G of still another embodiment of the present invention. (b) is a cross-sectional view of a TFT substrate 110G included in the liquid crystal display panel 100G, taken along line A-B of (a).
Figure 9:
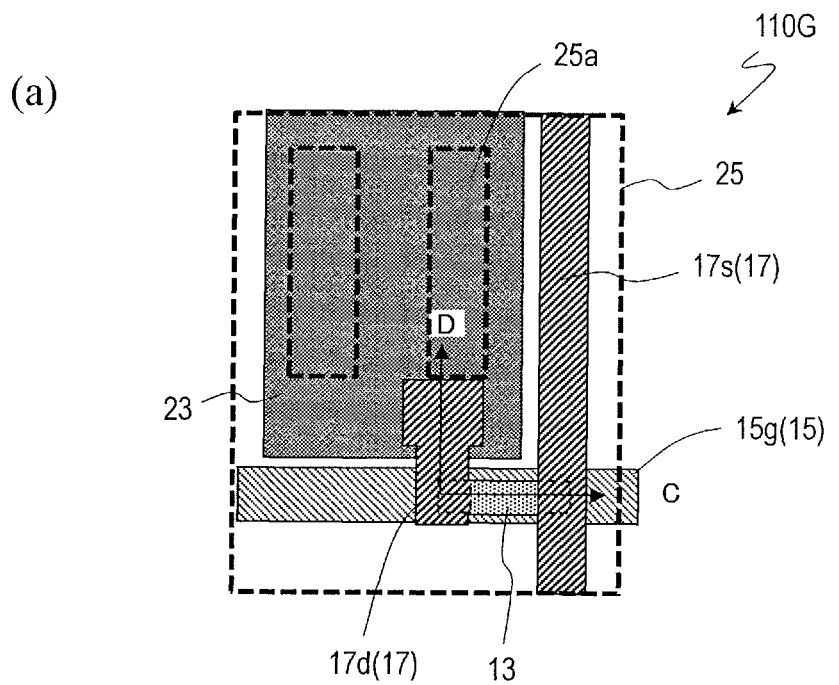
FIG. 9 Diagrams showing the configuration of a pixel portion of a TFT substrate 110G included in still another liquid crystal display panel of an embodiment of the present invention. (a) is a plan view of the TFT substrate 110G. (b) is a cross-sectional view of the TFT substrate 110G taken along line C-D of (a).
Figure 9:
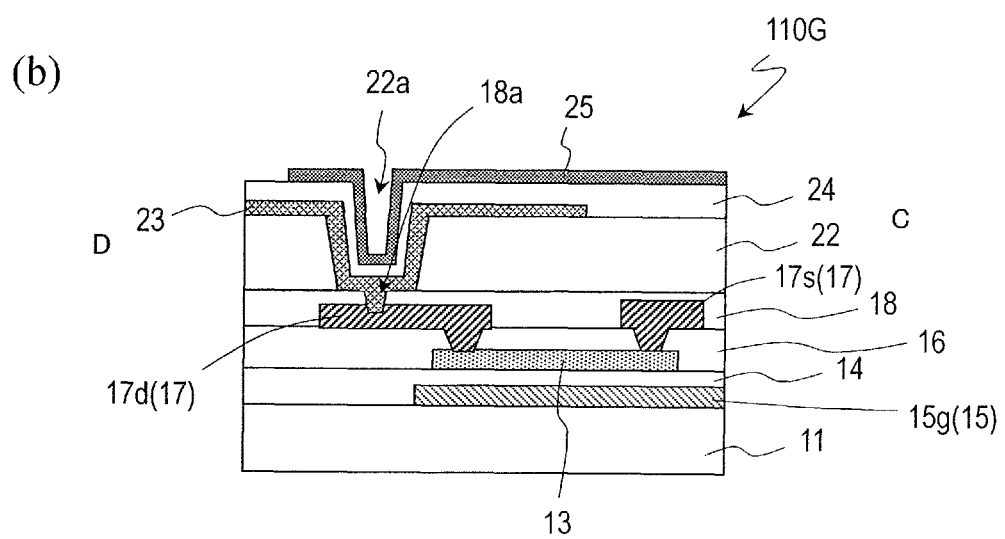

The configurations of a liquid crystal display panel 100G which has an etch stop type TFT and a TFT substrate 110G included in the liquid crystal display panel 100G are described with reference to FIG. 8 and FIG. 9. Note that the liquid crystal display panel 100G is a FFS mode liquid crystal display panel.

FIG. 8(a) is a plan view showing the liquid crystal display panel 100G. FIG. 8(b) is a cross-sectional view of the TFT substrate 110G taken along line A-B of FIG. 8(a). As shown in FIG. 8(a), the liquid crystal display panel 100G includes the TFT substrate 110G, a counter substrate 120G, a liquid crystal layer (not shown) provided between the TFT substrate 110G and the counter substrate 120G, and a seal portion 32 provided between the TFT substrate 110G and the counter substrate 120G so as to enclose the liquid crystal layer.

The TFT substrate 110G has openings 22a in an extended portion of the organic insulating layer 22, in the form of three grooves extending parallel to one another, at positions outer than the driver TFTs 30A and 30B, as does the TFT substrate 110A shown in FIG. 1(b). The groove-shaped openings 22a are arranged so as to enclose the display region DA, i.e., in an annular arrangement.

The TFTs 30A and 30B of the TFT substrate 110G are bottom gate TFTs as shown in FIG. 8(b) and include a gate metal layer 15 including a gate electrode 15g which is provided on the substrate (e.g., glass substrate) 11, a gate insulating layer 14 provided on the gate metal layer 15, a semiconductor layer 13 provided on the gate insulating layer 14, an inorganic insulating layer 16 covering the semiconductor layer 13, and a source metal layer 17 including a source electrode and a drain electrode, which is provided on the inorganic insulating layer 16 so as to be in contact with the semiconductor layer 13 in contact holes of the inorganic insulating layer 16. Parts of the inorganic insulating layer 16 lying on the channel region of the semiconductor layer 13 function as an etch stop layer 16es. Specifically, the etch stop layer 16es prevents the channel region of the semiconductor layer 13 from being etched away in forming the source and drain electrodes by patterning a source metal layer deposited on the inorganic insulating layer 16.

Next, the configuration of a pixel portion of the TFT substrate 110G is described with reference to FIGS. 9(a) and 9(b). FIG. 9(a) is a plan view of the pixel portion of the TFT substrate 110G. FIG. 9(b) is a cross-sectional view of the TFT substrate 110G taken along line C-D of FIG. 9(a).

In the TFT substrate 110G shown in FIGS. 9(a) and 9(b), the overlying conductive layer 25 functions as the common electrode while the underlying conductive layer 23 functions as the pixel electrode. In the TFT substrate 110G, the common electrode 25 has two slits 25a extending parallel to each other, and the pixel electrode 23 opposes the common electrode 25 via the inorganic insulating layer 24. The pixel electrode 23 has no slit. The pixel electrode 23 is connected with the drain electrode 17d in a contact hole 18a provided in the inorganic insulating layer 18 and an opening (contact hole) 22a provided in the organic insulating layer 22. The drain electrode 17d and a source electrode 17s are electrically coupled with the semiconductor layer 13 in contact holes of the inorganic insulating layer 16. The gate electrode 15g is arranged so as to oppose the semiconductor layer 13 via the gate insulating layer 14. This pixel TFT is also a bottom gate TFT which has an etch stop layer (inorganic insulating layer 16) as is the driver TFT shown in FIG. 8(b).

When a bottom gate TFT is thus employed and the TFT has an etch stop structure, this bottom gate TFT is more advantageous than a TFT which has a channel etch structure in that the tolerance to variation of the electric characteristics due to the moisture can be improved.

The above-described embodiments can be variously modified. For example, the configurations of the TFTs and the configurations of the openings in the organic insulating layer and the overlying and underlying structures of the openings for prevention of entry of the moisture, which have been described as examples in the above embodiments, can be employed in an appropriate combination.

In the examples which have been described above, both the gate driver and the source driver are provided in the TFT substrate, although only either one of the gate driver or the source driver may be provided. In this case, the structure for protection of the TFTs included in the driver from the moisture may be appropriately changed according to the arrangement of the driver. For example, when the gate driver is arranged along one side of the substrate, openings (grooves) in the organic insulating layer may be provided only at the side.

In the above-described examples, the display panel is a transverse electric field mode liquid crystal display panel, although the embodiment of the present invention is applicable to a liquid crystal display panel of any other display mode, such as a VA mode liquid crystal display panel, for example. Further, the embodiment of the present invention is not limited to a liquid crystal display panel but applicable to a monolithic display panel in which at least part of the driving circuit is provided in the TFT substrate, such as an organic EL display panel. That is, a display medium layer included in a display panel of an embodiment of the present invention may be a liquid crystal layer, an organic EL, or any other display medium layer.

INDUSTRIAL APPLICABILITY

A display panel of an embodiment of the present invention is applicable to a wide variety of monolithic display panels, including liquid crystal display panels, organic EL display panels, electrophoretic display panels, etc.

REFERENCE SIGNS LIST 11 substrate (glass substrate)
12 inorganic insulating underlayer
13 semiconductor layer
14 gate insulating layer
15 gate metal layer
15g gate electrode
16 inorganic insulating layer
17 source metal layer
17s source electrode
17d drain electrode
18 inorganic insulating layer
22 organic insulating layer
22a opening (groove) of organic insulating layer
23 underlying conductive layer (common electrode or pixel electrode)
24 inorganic insulating layer
25 overlying conductive layer (pixel electrode or common electrode)
30 driving circuit
30A, 30B driver TFTs
32 seal portion
100A, 100E, 100F, 100G, 200 liquid crystal display panel
110A, 110B, 110C, 110D, 110E, 110F, 110G, 210 TFT substrate
120A, 120E, 120F, 120G, 220 counter substrate

The invention claimed is:

1. A display panel, comprising:
a first substrate;
a second substrate that opposes the first substrate;
a display medium layer provided between the first substrate and the second substrate;
a seal portion provided between the first substrate and the second substrate so as to enclose the display medium layer;
a plurality of pixel regions each including first and second electrodes that apply a voltage across the display medium layer and a pixel TFT connected with the first electrode; and a driving circuit that supplies a predetermined signal voltage to the pixel TFT of each of the plurality of pixel regions, the driving circuit including a plurality of driver TFTs, wherein the display panel includes a display region including the plurality of pixel regions and a frame region provided around the display region, the display region further includes an organic insulating layer provided on the display medium layer side of the pixel TFT, the frame region includes the seal portion, the driving circuit, and an extended portion of the organic insulating layer, the extended portion of the organic insulating layer is provided on the display medium layer side of the plurality of driver TFTs, is overlapped by at least a portion of the plurality of driver TFTs, and includes at least one opening which is positioned farther outward than the plurality of driver TFTs and which reaches an underlayer, the seal portion overlaps at least a portion of the plurality of driver TFTs and covers at least a portion of the at least one opening provided in the extended portion of the organic insulating layer, and the at least one opening provided in the extended portion of the organic insulating layer is covered with an inorganic insulating layer.

2. The display panel of claim 1, wherein the at least one opening provided in the extended portion of the organic insulating layer includes a plurality of grooves extending parallel to one another.

3. The display panel of claim 1, wherein the at least one opening provided in the extended portion of the organic insulating layer continuously extends to at least one side of the first substrate.

4. The display panel of claim 1, wherein the at least one opening provided in the extended portion of the organic insulating layer encloses the display region.

5. The display panel of claim 1, wherein the at least one opening provided in the extended portion of the organic insulating layer is further covered with an inorganic layer or a metal layer.

6. The display panel of claim 1, wherein the underlayer in the at least one opening provided in the extended portion of the organic insulating layer is an inorganic layer or a metal layer.

7. The display panel of claim 1, wherein the seal portion contains no electrically-conductive particle.

8. The display panel of claim 1, wherein the plurality of driver TFTs includes a bottom gate TFT.

9. The display panel of claim 8, wherein the bottom gate TFT includes an etch stop structure.

10. The display panel of claim 1, wherein the plurality of driver TFTs has an In—Ga—Zn—O based semiconductor layer.

11. The display panel of claim 1, wherein the display medium layer is a liquid crystal layer.

12. The display panel of claim 11, wherein the first and second electrodes are provided in the first substrate and the display panel operates in a transverse electric field mode.

13. The display panel of claim 1, wherein the underlayer in the at least opening provided in the extended portion of organic insulating layer is an inorganic layer.

14. The display panel of claim 1, wherein the underlayer in the at least opening provided in the extended portion of organic insulating layer is an inorganic insulating layer.

* * * * *